(12) United States Patent
Jin et al.

(10) Patent No.: US 7,133,886 B2
(45) Date of Patent: Nov. 7, 2006

(54) INTERACTIVE ADAPTIVE FILTER AND INTERACTIVE ADAPTIVE FILTERING METHOD THEREOF

(75) Inventors: Minglu Jin, Daejon (KR); Sooyoung Kim, Daejon (KR); Deock Gil Oh, Daejon (KR); Jae Moung Kim, Seoul (KR)

(73) Assignee: Electronics and Telecommunications Research Institute (KR)

( * ) Notice: Subject to any disclaimer, the term of this patent is extended or adjusted under 35 U.S.C. 154(b) by 719 days.

(21) Appl. No.: 10/455,932

(22) Filed: Jun. 6, 2003

(65) Prior Publication Data

US 2004/0117417 A1   Jun. 17, 2004

(30) Foreign Application Priority Data

Dec. 13, 2002   (KR) .................. 10-2002-0079725

(51) Int. Cl.
*G06F 17/10* (2006.01)

(52) U.S. Cl. ..................................... 708/322
(58) Field of Classification Search .................. None
See application file for complete search history.

(56) References Cited

U.S. PATENT DOCUMENTS

| | | | |
|---|---|---|---|
| 5,428,562 A | 6/1995 | Gay | |
| 5,889,857 A | 3/1999 | Boudy et al. | |
| 6,141,378 A * | 10/2000 | d'Oreye de Lantremange | ............... 375/232 |
| 6,151,614 A * | 11/2000 | Ikeda | ........................ 708/322 |
| 6,289,046 B1 * | 9/2001 | Takeuchi et al. | ............ 375/232 |
| 6,332,000 B1 * | 12/2001 | Lee | ............................ 375/232 |
| 6,405,229 B1 | 6/2002 | Takano et al. | |

FOREIGN PATENT DOCUMENTS

| | | |
|---|---|---|
| JP | 09-167945 | 6/1997 |
| KR | 2001-27749 | 4/2001 |

OTHER PUBLICATIONS

An-Yeu Wu, "Split Recursive Least-Squares: Algorithms, Architectures, and Applications" 1996 IEEE; vol. 43, No. 9, Sep. 1996, pp. 645-658.
Tai-Kuo Woo, "hrls: A More Efficient Rls Algorithm For Adaptive Fir Filtering" 2001 IEEE, vol. 5, No. 3, Mar. 2001, pp. 81-84.

* cited by examiner

*Primary Examiner*—D. H. Malzahn
(74) *Attorney, Agent, or Firm*—Blakely Sokoloff Taylor & Zafman

(57) ABSTRACT

Provided is an adaptive filter that can reduce the computational complexity. The adaptive filter includes: a segmentation unit for segmenting N number of input signals into G number of signal groups; sub-filter unit having G number of sub-filters, which are corresponding to each of the signal groups, for filtering the corresponding signal group; an addition unit for summating the output signals of the sub-filter unit; an error computing unit for generating an error signal by comparing the output signals of the addition unit with a desired signal; filter coefficient updating unit having G number of filter coefficient updating units, each of which is corresponding to each of the sub-filters, for updating the filter coefficient of the corresponding sub-filter; and a switching unit for inputting the error signal to any one of the filter coefficient updaters optionally with respect to an iteration number k.

12 Claims, 6 Drawing Sheets

INTERACTIVE ADAPTIVE FILTER AND INTERACTIVE ADAPTIVE FILTERING METHOD THEREOF

FIELD OF THE INVENTION

The present invention relates to an adaptive filter and filtering method thereof; and, more particularly to an adaptive filter having a reduced computational complexity.

DESCRIPTION OF RELATED ART

Adaptive filters are used in various areas, such as identification, inverse modeling, prediction, and interference cancellation.

FIG. 1 is a block diagram illustrating a configuration of a typical adaptive filter. In the drawing, a variable 'k' is an iteration number; $x_i(k)(i=0,1,\Lambda,N-1)$ denotes an $i^{th}$ input signal; y(k) is an output signal of the adaptive filter; and d(k) is a desired signal. An error signal e(k) is computed as d(k)−y(k). Adaptive filters appropriately update a filter coefficient $W_i(k)(i=0,1,\Lambda,N-1)$, based on the computed error signal e(k). In other words, the filter coefficient $W_i(k)(i=0,1,\Lambda,N-1)$ is updated in a way for minimizing a given objective function.

In a least square algorithm, the objective function is given as shown in Equation 1, which is disclosed in "Adaptive Filtering: Algorithms and Practical Implementation" (Paulo Sergio Ramirez Diniz, Kluwer Academic Publisher, 1997) that is incorporated herein by reference.

$$J(k) = \sum_{i=0}^{k} \lambda^{k-i} e^2(i)$$
$$= \sum_{i=0}^{k} \lambda^{k-1}[d(i) - X^T(i)\theta(k)]^2 \qquad \text{Eq. 1}$$

where $X(i)=[x_0(i),\Lambda,x_{N-1}(i)]^T$ denotes an input vector at an instant value i;

$\theta(k)=[W_0(k),\Lambda,W_{N-1}(k)]^T$ denotes an adaptive filter coefficient vector; and λ denotes an exponential weighting factor selected within a predetermined range.

Following Equation 2 can be obtained by differentiating J(k) with respect to θ(k) and equalizing the differential equation to zero.

$$\theta(k) = \left[\sum_{i=0}^{k} \lambda^{k-i} X(i)X^T(i)\right]^{-1} \sum_{i=0}^{k} \lambda^{k-1} X(i)d(i) \qquad \text{Eq. 2}$$
$$= R^{-1}(k)P(k)$$

where R(k) denotes a deterministic correlation matrix of an input signal; and

P(k) denotes a deterministic cross-correlation vector between the input signal and a desired signal.

A reversed function of R(k) is computed by an algorithm having a computational complexity of $O(N^3)$. Conventional recursive least squares (RLS) algorithm updates the coefficient of a filter by using a matrix inversion lemma as described below, instead of performing the reversed function directly.

According to the matrix inversion lemma, the reversed function of R(k) is computed as shown in Equation 3.

$$S(k) = R^{-1}(k) = \frac{1}{\lambda}\left[S(k-1) - \frac{S(k-1)X(k)X^T(k)S(k-1)}{\lambda + X^T(k)S(k-1)X(k)}\right] \qquad \text{Eq. 3}$$

Equations used in the conventional RLS algorithm are described as below.

At an initialization, below equations 4 and 5 are computed.

$$S(-1)=\delta^{-1}I_{N\times N} \qquad \text{Eq. 4}$$

$$P(-1)=X(-1)=[00\Lambda 0]^T \qquad \text{Eq. 5}$$

When K≧0 then below equations 6 to 8 are computed.

$$S(k) = \frac{1}{\lambda}\left[S(k-1) - \frac{S(k-1)X(k)X^T(k)S(k-1)}{\lambda + X^T(k)S(k-1)X(k)}\right] \qquad \text{Eq. 6}$$

$$P(k)=\lambda P(K-1)+d(k)X(k) \qquad \text{Eq. 7}$$

$$\theta(k)=S(k)P(k) \qquad \text{Eq. 8}$$

Occasionally, below equations 9 and 10 are computed.

$$y(k)=\theta^T(k)X(k) \qquad \text{Eq. 9}$$

$$e(k)=d(k)-y(k), \qquad \text{Eq. 10}$$

where δ denotes an inverse of an input signal power estimate; and $I_{N\times N}$ denotes a unit matrix of an N×N dimension.

As seen from Eqs. 4 through 10, since there are matrix multiplications with an order of N, the computational complexity is proportional to $O(N^2)$ in the conventional RLS algorithm.

The main concern in practical implementation of the adaptation algorithms is computational complexity, which generally depends on the number of filter coefficients.

To alleviate the computational cost of the RLS, a family of fast RLS algorithms such as fast transversal filters, RLS lattice filters, and QR-decomposition based lattice filters (QRD-RLS), have been explained by Simon Haykin in an article entitled "Adaptive Filter Theory" Fourth edition, Prentice Hall, 2002, which is incorporated herein by reference. Exploiting the special structure of the input data matrix, they can perform RLS estimation with O(N) complexity. One of the major disadvantages of these fast RLS algorithms is that they work for data with shifting input (structured data) only.

By applying multiple decompositions of the signal space, Wu and Tai proposed a method of reduced complexity RLS algorithms for non-structured data in "Split Recursive Least Squares: Algorithms, Architectures, and Applications," by An-Yeu Wu and K. J. Ray Liu, IEE Trans Circuits and Systems Part II: Analog and Digital Signal Processing, Vol. 43, pp. 645–658, September 1996) and "HRLS: A more Efficient RLS Algorithm for Adaptive FIR Filtering," by Tai-Kuo Woo, IEEE Communications Letter, Vol. 5, No. 3, March 2001. The proposed method of reduced complexity RLS algorithms are shown in FIGS. 2 and 3.

FIG. 2 is a block diagram showing a configuration of an adaptive filter according to a prior art. As shown in the drawing, the input signal $\{x_0(k),x_1(k),\Lambda,x_i(k),x_{i+1}(k),\Lambda,x_{N-1}(k)\}$ is grouped into two sets: $\{x_0(k),x_1(k),\Lambda,x_i(k)\}$ and {$x_{i+1}(k), \Lambda, x_{N-1}(k)$}. Each of them is provided to a first filter 201 and a second filter 202, respectively. The outputs of the first and second filters 201 and 202, $y_1(k)$ and $y_2(k)$, are inputted to a third filter 203, which outputs y(k). The output $y_1(k)$ of the first filter 201 is compared with the desired signal d(k) at a first error computing unit 207 and an error signal $e_1(k)$ is outputted. The error signal $e_1(k)$ is fed back to a first filter coefficient updating unit 204.

The output $y_2(k)$ of the second filter 202 is compared with the desired signal d(k) at a second error computing unit 208 and an error signal $e_2(k)$ is outputted. The error signal $e_2(k)$ is fed back to a second filter coefficient updating unit 205.

The output y(k) of the third filter 203 is compared with the desired signal d(k) at a third error computing unit 209 and an error signal e(k) is outputted. The error signal e(k) is fed back to a third filter coefficient updating unit 206. The first, second and third filter coefficient updating unit 204, 205 and 206 are used to update the first filter coefficient {$W_0(k), W_1(k), \Lambda, W_i(k)$}, the second filter coefficient {$W_{i+1}(k), \Lambda, W_{N-1}(k)$}, and the third filter coefficient {$W'_1(k), W'_2(k)$}, respectively.

In this adaptation algorithm, all of the filter coefficients are updated simultaneously at each iteration number k. A first filter 201 and a second filter 202 can be further decomposed into sub-filters of a lower order. Thus, the minimum computational complexity can be O(N), if N is power of 2.

FIG. 3 is a block diagram describing a configuration of an adaptive filter according to another prior art. As shown in FIG. 3, the configuration of the adaptive filter is almost the same as FIG. 2. When the third filter 203 and the third filter coefficient updating unit 206 are removed from FIG. 2 and replaced with an adder 305, it becomes a simplified configuration of the filter shown in FIG. 2. In short, FIG. 3 is a tabloid edition of the filter illustrated in FIG. 2. The problem of the two types of filters shown in FIGS. 2 and 3 is that the filters are acceptable only for input vectors with almost non-correlated components.

SUMMARY OF THE INVENTION

It is, therefore, an object of the present invention to provide an apparatus and method for reducing the computational complexity of adaptive filters.

In accordance with an aspect of the present invention, there is provided an adaptive filter, including: a segmentation unit for segmenting N number of input signals into G number of signal groups wherein N and G are an integer not less than 1; sub-filter unit having G number of sub-filters, which are corresponding to each of the signal groups, for filtering the corresponding signal group; an addition unit for summating the output signals of the sub-filter unit; an error computing unit for generating an error signal by comparing the output signals of the addition unit with a desired signal; filter coefficient updating unit having G number of filter coefficient updating units, each of which is corresponding to each of the sub-filters in the sub-filter means, for updating the filter coefficient of the corresponding sub-filter; and a switching unit for inputting the error signal to any one of the filter coefficient updating means optionally with respect to an iteration number k, wherein the iteration number k is an integer number not less than 1 and represents the number of performing entire operations of the adaptive filter.

In accordance with another aspect of the present invention, there is provided a filtering method of an adaptive filter that includes G number of sub-filters and filter coefficient updating unit corresponding to each sub-filters, including the steps of: a) segmenting N number of input signals into G number of signal groups, wherein N and G are an integer not less than 1; b) performing sub-filtering with respect to each of the G number of signal groups corresponding to the G number of sub-filters; c) summating the output signals of the sub-filtering; d) generating an error signal by comparing the output signals with a desired signal; e) each of the filter coefficient updaters updating the filter coefficient of the corresponding sub-filters based on the error signal; and f) switching the error signal to any one of the filter coefficient updaters optionally with respect to an iteration number k to update the filter coefficient of the corresponding sub-filters.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Figure 1:
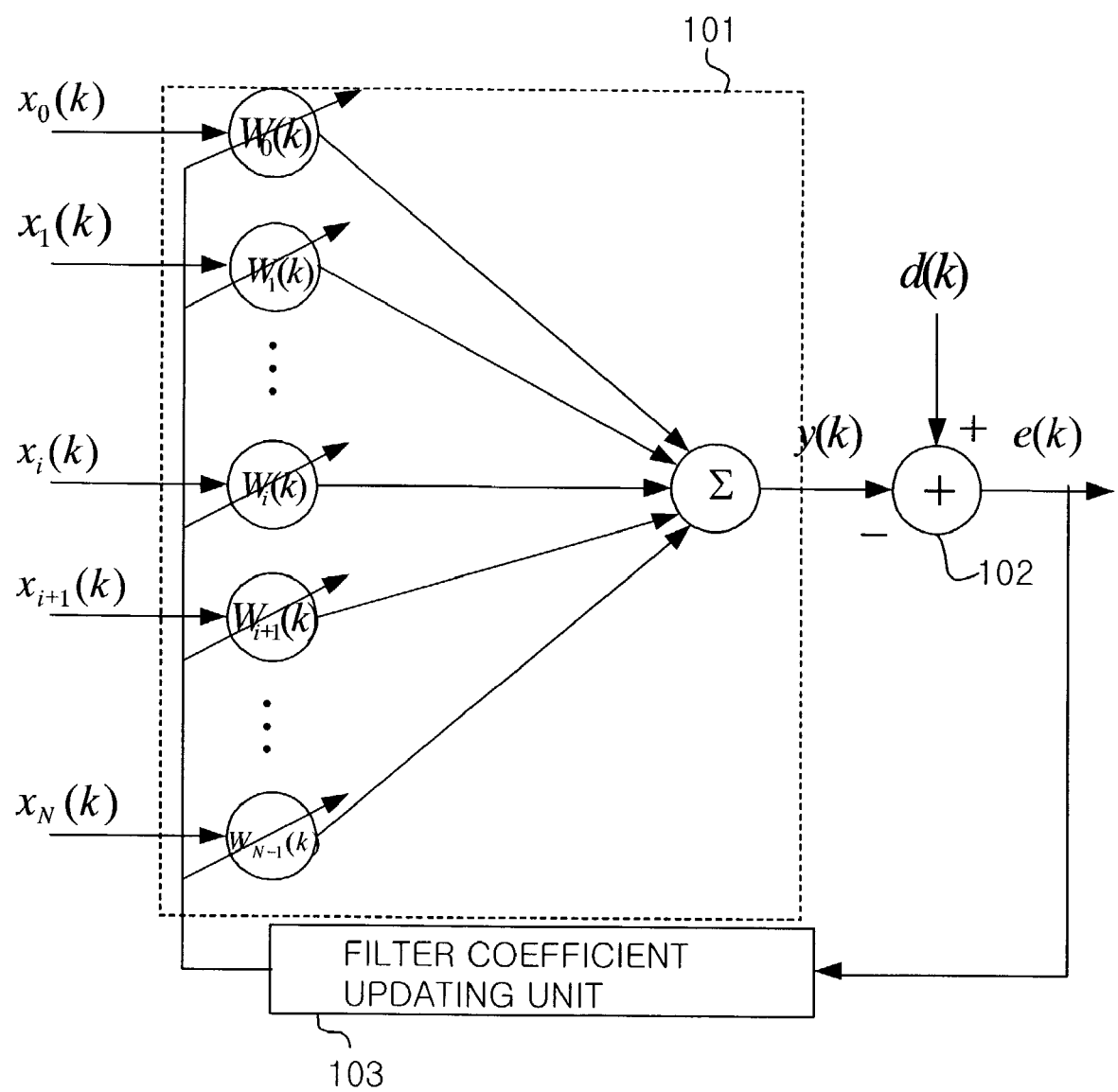
FIG. 1 is a block diagram illustrating a configuration of a typical adaptive filter.

The computational complexity of the adaptive filter algorithm is proportional to the length of input signal vector and the number of filter coefficients, which are simultaneously updated.

To reduce the computational complexity of an adaptive filter algorithm, the filter is implemented by composing a plurality of sub-filters with a smaller number of filter coefficients to be updated, and at each iteration step, only the filter coefficients of a single sub-filter is modified by the adaptation algorithm, while the filter coefficients of other sub-filters remain unchanged.

Following description only exemplifies the principle of the present invention. Although the description of the principle may not be clear or all possible embodiments of the present invention is not illustrated in the specification, those skilled in the art can embody the principle of the present invention and invent various apparatus within the scope and concept of the present invention from the description. Also, all the conditional terms and embodiments described in the specification are intended to make the concept of this invention understood, in principle, and the present invention should be understood not limited to the described embodiments or conditions only.

All the detailed description on a particular embodiment as well as the principle, view points and embodiments should be understood to include structural and functional equivalents. Those equivalents should be understood to include those currently known and to be developed in future. That is, they include all devices developed to perform the function of the element disclosed in the present invention, regardless of their structures.

For example, block diagrams of the specification should be understood to show a conceptual viewpoint of an exemplary circuit that embodies the principle of the present invention. Similarly, all the flow charts, diagrams and pseudo-code may can be implemented as software can be stored in a computer-readable medium, practically. Even though a computer or a process is not described evidently, they should be understood to show diverse processes performed by a computer or a processor.

The functions of elements illustrated in the drawing including a functional block marked as a processor or a similar concept of the processor can be provided not only by a dedicated hardware but also by using hardware capable of executing proper software that can perform the functions.

When the functions of elements are provided by a processor, the processor can be a single processor dedicated to the function only, a single shared processor or a plurality of individual processors, part of which can be shared.

The apparent use of terms such as processor, controller, or terms having similar concept should not be exclusively construed to be hardware capable of executing software, but include digital signal processor (DSP) hardware, ROM, RAM and non-volatile memory for recording software implicitly. Here, other known or commonly used hardware can be included. Similarly, switches illustrated in the drawings may be suggested conceptually only. Such switches should be understood being controlled by a program logic or a dedicated logic, or controlled manually. Particular technologies may be selected by a designer to make the present specification better understood.

In claims of the specification, an element expressed as a means for performing a function described in the detailed description part of this specification is intended to include a combination of circuits that performs the function, or all methods for performing the function including all formats of software including firmware and micro code. They are connected to a proper circuit for executing the software. The present invention defined by such claims is connected to other functions provided by various means in a method defined by the claims. Thus, any means that can provide the function should be understood to be equivalent to what is figured out from the specification.

Other objects and aspects of the invention will become apparent from the following description of the embodiments with reference to the accompanying drawings, which is set forth hereinafter. The same reference number is given to the same element, though it appears in different drawings. Also, any description that may unnecessarily blur the point of the present invention is omitted from the detailed description. Hereinafter, preferred embodiments of the present invention will be described with reference to the accompanying drawings.

As described before, the computational complexity of adaptive filter is a bottleneck to practical implementation of adaptive filter and there are a number of fast algorithms disclosed.

Although fast recursive least squares filters can reduce the computational complexity to O(N), compared to conventional methods with computational complexity of O($N^2$), they have a shortcoming that they are applied to some data having a specific structure only.

Split Recursive Least Squares (SRLS) algorithm or High Dimensional Recursive Least Square (HRLS) algorithm are applicable to non-structured data and can reduce the computational complexity to O(N), when N is power of 2. However, there is a problem that the performance of these types of filters are acceptable to input vectors having almost non-correlated components.

Similarly to the SRLS or HRLS algorithm, the present invention also performs data processing on the non-structured input data, and the computational complexity can be reduced to O(1), regardless of the N value.

Figure 4:
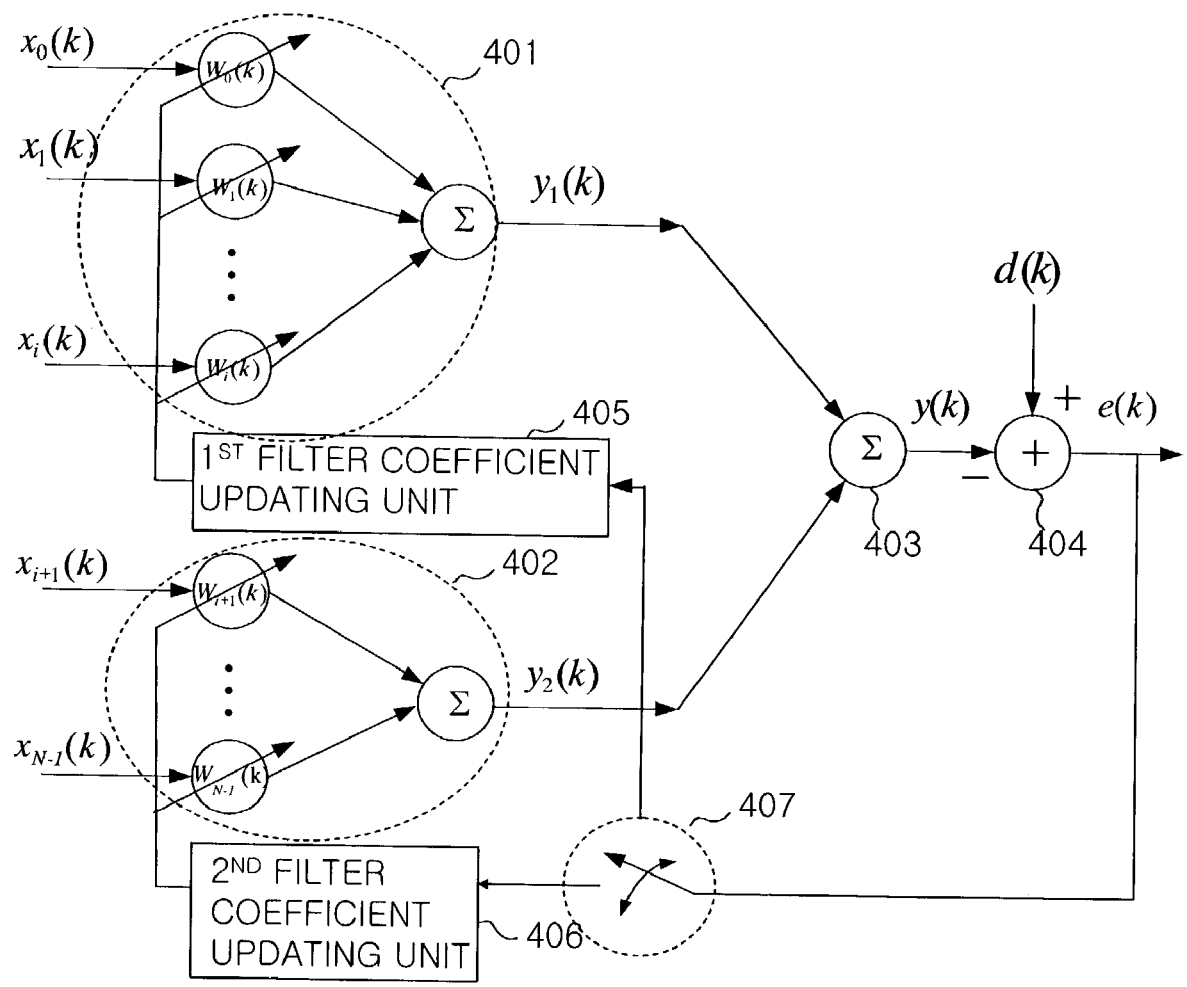
FIG. 4 is a block diagram illustrating a configuration of an interactive adaptive filter in accordance with an embodiment of the present invention.

FIG. 4 is a block diagram illustrating a configuration of an interactive adaptive filter in accordance with an embodiment of the present invention. As shown in the drawing, an input signal $\{x_0(k),x_1(k),\Lambda,x_i(k),x_{i+1}(k),\Lambda,x_{N-1}(k)\}$ is grouped into two sets, $\{x_0(k),x_1(k),\Lambda,x_i(k)\}$ and $\{x_{i+1}(k),\Lambda,x_{N-1}(k)\}$. Each of them is inputted to a first filter 401 and a second filter 402, respectively. Although a segmentation unit is not shown in the drawing, the input signal $\{x_0(k),x_1(k),\Lambda,x_i(k),x_{i+1}(k),\Lambda,x_{N-1}(k)\}$, is divided into two sets, $\{x_0(k),x_1(k),\Lambda,x_i(k)\}$ and $\{x_{i+1}(k),\Lambda,x_{N-1}(k)\}$, by the segmentation unit.

To describe the embodiment of the present invention, FIG. 4 discloses the input signal $\{x_0(k),x_1(k),\Lambda,x_i(k),x_{i+1}(k),\Lambda,x_{N-1}(k)\}$ grouped into two sets, $\{x_0(k),x_1(k),\Lambda,x_i(k)\}$ and $\{x_{i+1}(k),\Lambda,x_{N-1}(k)\}$, and inputted to the first and second filter 401 and 402, respectively. However, it is obvious to those skilled in the art that the number of groups segmented from the input signal $\{x_0(k),x_1(k),\Lambda,x_i(k),x_{i+1}(k),\Lambda,x_{N-1}(k)\}$, and the number of filters for corresponding groups of segmented input signals could be changed. Therefore, the present invention should be understood not limited to a case where an input signal is grouped into two sets.

The first and second filters 401 and 402 corresponds to the segmented input signals $\{x_0(k),x_1(k),\Lambda,x_i(k)\}$ and $\{x_{i+1}(k),\Lambda,x_{N-1}(k)\}$, respectively, and they include a multiplication unit for multiplying each input signal by the first filter coefficient $\{W_0(k),W_1(k),\Lambda,W_i(k)\}$ and the second filter coefficient $\{W_{i+1}(k),\Lambda,W_{N-1}(k)\}$, respectively.

The first filter 401 outputs $y_1(k)$ which is a summation of the multiplications of $\{x_0(k),x_1(k),\Lambda,x_i(k)\}$ and $\{W_0(k),W_1(k),\Lambda,W_i(k)\}$, and the second filter 402 outputs $y_2(k)$ which is a summation of the multiplications of $\{x_{i+1}(k),\Lambda,x_{N-1}(k)\}$ and $\{W_{i+1}(k),\Lambda,W_{N-1}(k)\}$.

The outputs $y_1(k)$ and $y_2(k)$ of the first and second filters 401 and 402 are inputted to an adder 403 and the adder 403 outputs y(k).

The output y(k) of the adder 403 is compared with a desired signal d(k) in an error computing unit 404 and an error signal e(k) is outputted. The error signal e(k) is fed back to a first filter coefficient updating unit 405 or a second filter coefficient updating unit 406. The first and second filter coefficient updating unit 405 and 406 are used to update the first filter coefficient $\{W_0(k),W_1(k),\Lambda,W_i(k)\}$ and the second filter coefficient $\{W_{i+1}(k),\Lambda,W_{N-1}(k)\}$, respectively.

All filter coefficients of sub-filters (i.e., a first filter 401 and a second filter 402) that are determined in the first and second filter coefficient updating unit 405 and 406 are modified based on an adaptation algorithm recursively. The adaptation algorithms used for updating the filter coefficients of the sub-filters need not be always the same. For example, the first filter coefficient updating unit 405 updates the first filter coefficient $\{W_0(k),W_1(k),\Lambda,W_i(k)\}$ based on the RLS algorithm, and the second filter coefficient updating unit 406 can update the second filter coefficient $\{W_{i+1}(k),\Lambda,W_{N-1}(k)\}$ based on a least mean square (LMS) algorithm.

Figure 2:
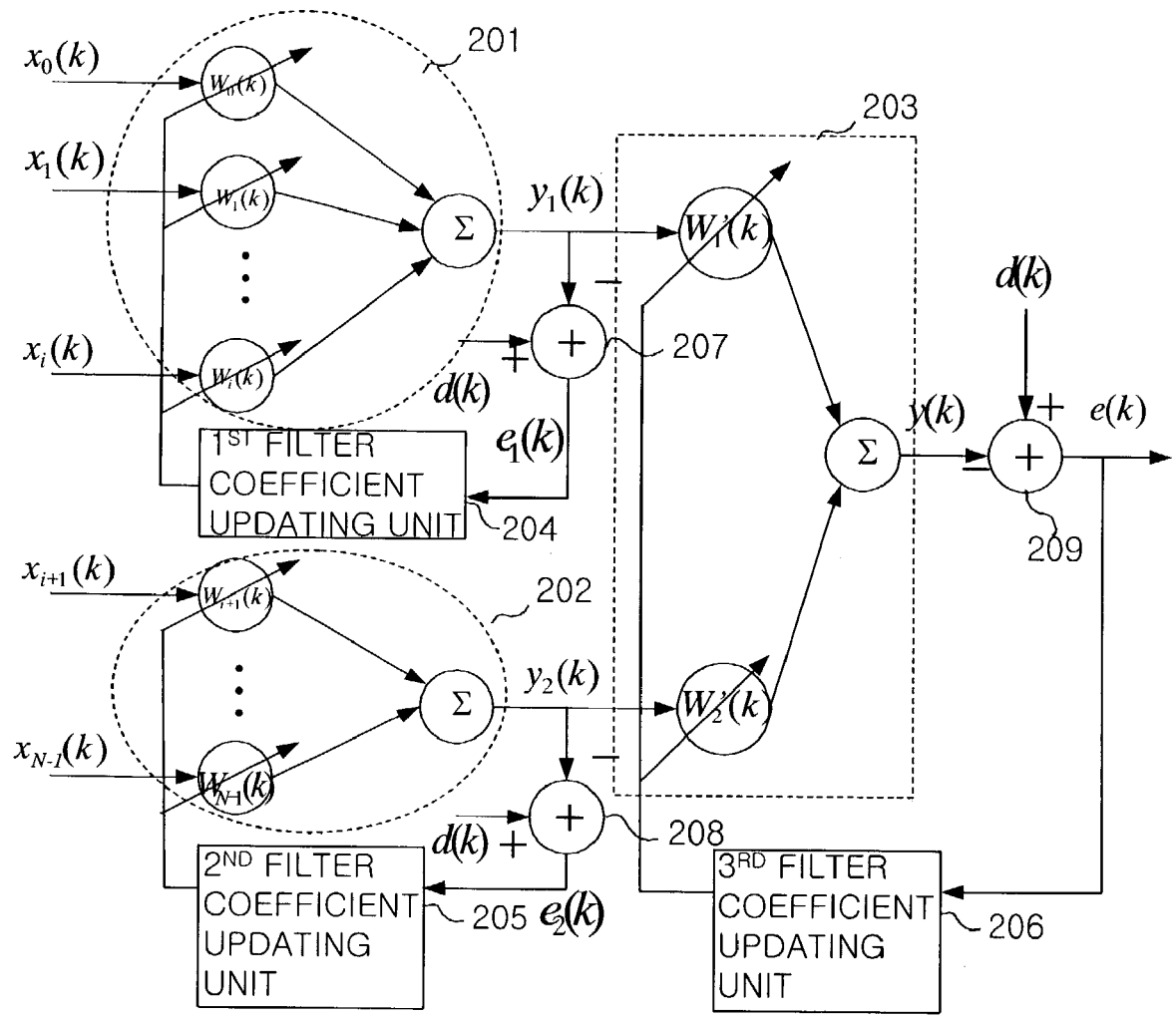
FIG. 2 is a block diagram showing a configuration of an adaptive filter according to a prior art.
Figure 3:
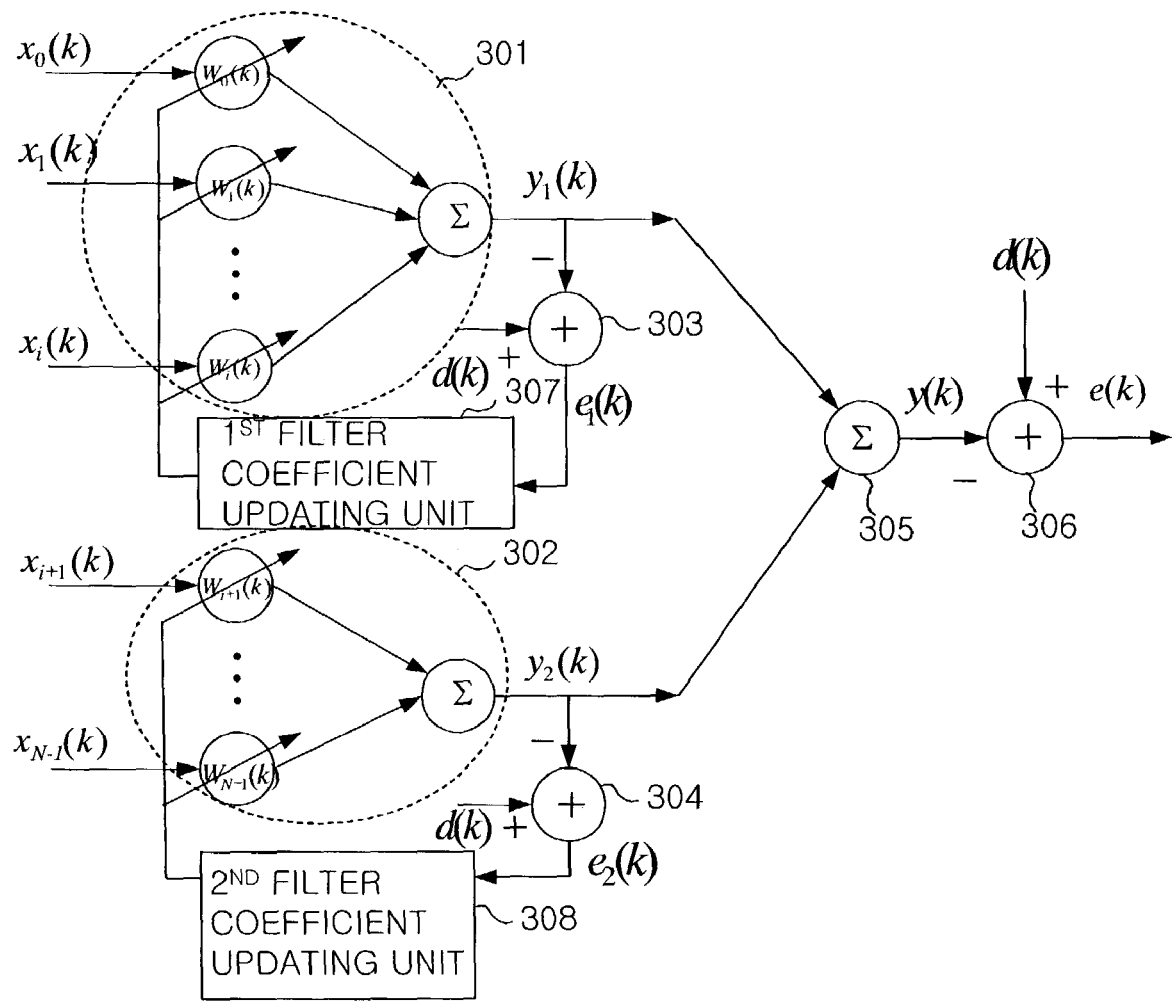
FIG. 3 is a block diagram describing a configuration of an adaptive filter according to another prior art.

The difference between the embodiment of the present invention shown in FIG. 4 and the prior art illustrated in FIGS. 2 and 3 are as below.

1. From a viewpoint of error signals used in the adaptation algorithm, different error signals are applied to the first filter coefficient updating unit 204 and 307 and the second filter coefficient updating unit 205 and 308 for adaptation algorithm. However, the embodiment of the present invention use the same error signal for the adaptation algorithms of the first and second filter coefficient updating unit 405 and 406.

2. From a viewpoint of the execution of the adaptation algorithm, the prior art simultaneously operates the adaptation algorithms at both of the first filter coefficient updating unit 204 and 307 and the second filter coefficient updating unit 205 and 308. However, the embodiment of the present invention alternatively executes the adaptation algorithms of the first filter coefficient updating unit 405 and the second filter coefficient updating unit 406.

Figure 5:
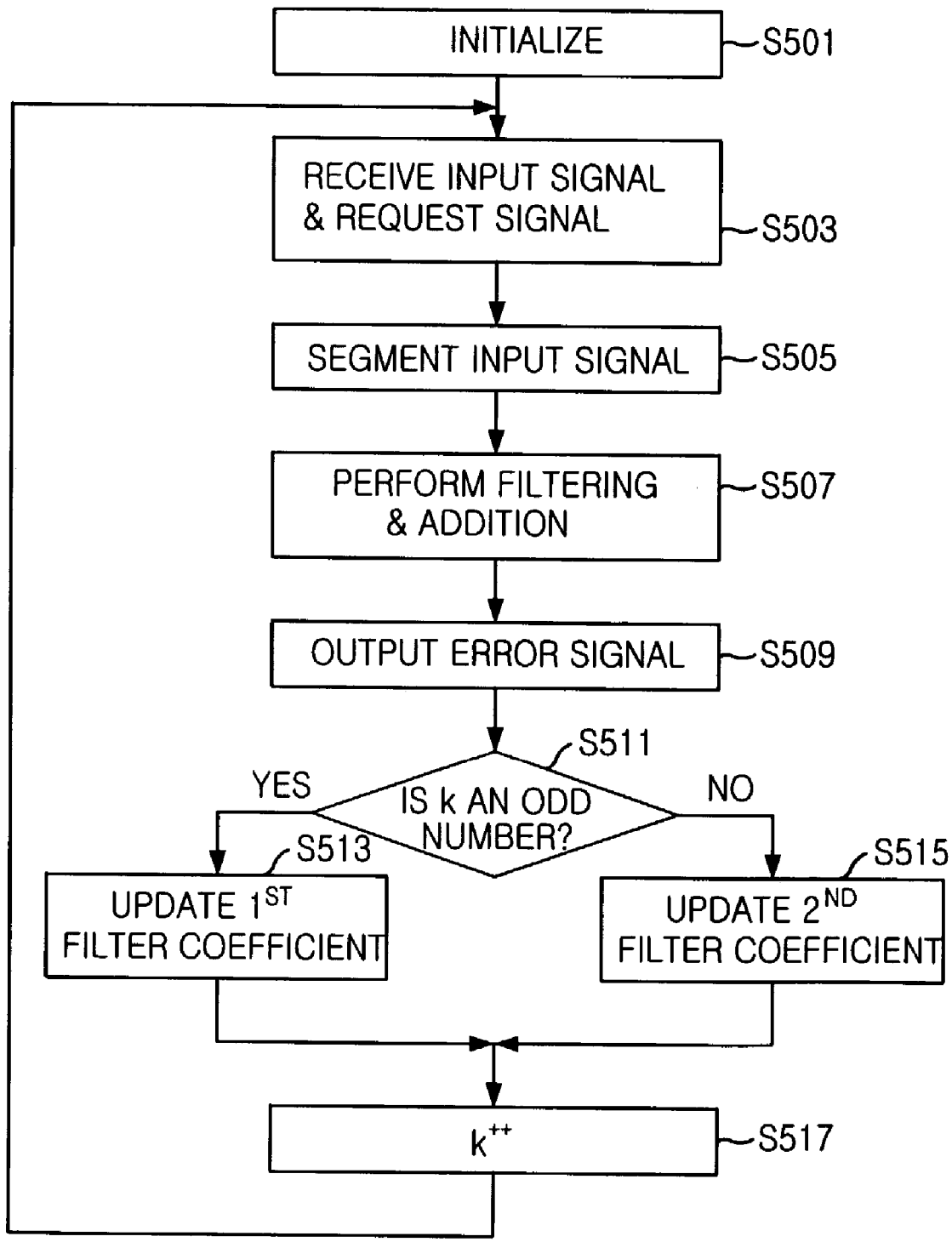
FIG. 5 is a flow chart describing an interactive adaptive filtering process in accordance with an embodiment of the present invention.

FIG. 5 is a flow chart describing an interactive adaptive filtering process in accordance with an embodiment of the present invention. The drawing shows the operation processes performed in the interactive adaptive filter of FIG. 4. As shown in FIG. 5, at step S501, the interactive adaptive filter is initialized in accordance with the present invention, before the filtering process is performed. In this step, the filter coefficient and parameters of the adaptation algorithm is initialized to their initial values.

Subsequently, at step S503, the input signal $\{x_0(k),x_1(k),\Lambda,x_i(k),x_{i+1}(k),\Lambda,x_{N-1}(k)\}$ or a desired signal d(k) are received. At step S505, the input signal $\{x_0(k),x_1(k),\Lambda,x_i(k),x_{i+1}(k),\Lambda,x_{N-1}(k)\}$ is segmented into two sets, $\{x_0(k),x_1(k),\Lambda,x_i(k)\}$ and $\{x_{i+1}(k),\Lambda,x_{N-1}(k)\}$, for the first filter 401 and the second filter 402.

At step S507, filtering is performed with respect to the two sets $\{x_0(k),x_1(k),\Lambda,x_i(k)\}$ and $\{x_{i+1}(k),\Lambda,x_{N-1}(k)\}$ in the first and second filters 401 and 402 and the results are outputted to the adder 403, which summates the signals $y_1(k)$ and $y_2(k)$ outputted from the first and second filters 401 and 402, respectively, to output y(k).

At step S509, the error computing unit 404 compares the signal y(k) with the desired signal d(k) to output an error signal e(k). At step S511, the switching unit 407 determines whether the iteration number k is an odd number or an even number.

At step S513, if the iteration number k is an odd number (or an even number), the switching is performed to input the error signal e(k) into the first filter coefficient updating unit 405 and thereby update the first filter coefficient $\{W_0(k),W_1(k),\Lambda,W_i(k)\}$. Otherwise, if the iteration number k is an even number (or an odd number), at step S515, the switching is performed to input the error signal e(k) into the second filter coefficient updating unit 406 and thereby update the second filter coefficient $\{W_{i+1}(k),\Lambda,W_{N-1}(k)\}$.

To describe the embodiment of the present invention, FIG. 4 shows the input signal $\{x_0(k),x_1(k),\Lambda,x_i(k),x_{i+1}(k),\Lambda,x_{N-1}(k)\}$, grouped into two sets $\{x_0(k),x_1(k),\Lambda,x_i(k)\}$ and $\{x_{i+1}(k),\Lambda,x_{N-1}(k)\}$, each of which is inputted into the first and second filters 401 and 402, respectively. Then, the error signal e(k) is switched to be inputted into the first filter coefficient updating unit 405 or the second filter coefficient updating unit 406 based on whether the iteration number k is an odd number or an even number, to thereby update the filter coefficients alternatively. However, as described before, it is obvious to those skilled in the art that the number G of sets the input signal $\{x_0(k),x_1(k),\Lambda,x_i(k),x_{i+1}(k),\Lambda,x_{N-1}(k)\}$ is grouped into and the number of filters based on the number of groups can be changed variously.

Therefore, it is obvious to those skilled in the art that the switching process of the error signal e(k) to the filter coefficient updating unit based on the modulo computation with respect to the iteration number k and the filter coefficient updating process, which is performed alternatively, can be changed variously. Thus, the present invention should be understood not limited to the structure where an error signal e(k) is switched to be inputted into the first filter coefficient updating unit 405 or the second filter coefficient updating unit 406 and the first and second filter coefficient updating units 405 and 406 update the filter coefficients alternatively based on whether the iteration number k is an odd number or an even number, as illustrated in the drawings.

After the step S513 or S515, the iteration number k is increased, and the logic flow returns to the step S503 to receive a new input signal $\{x_0(k),x_1(k),\Lambda,x_i(k),x_{i+1}(k),\Lambda,x_{N-1}(k)\}$ and a desired signal.

Figure 6:
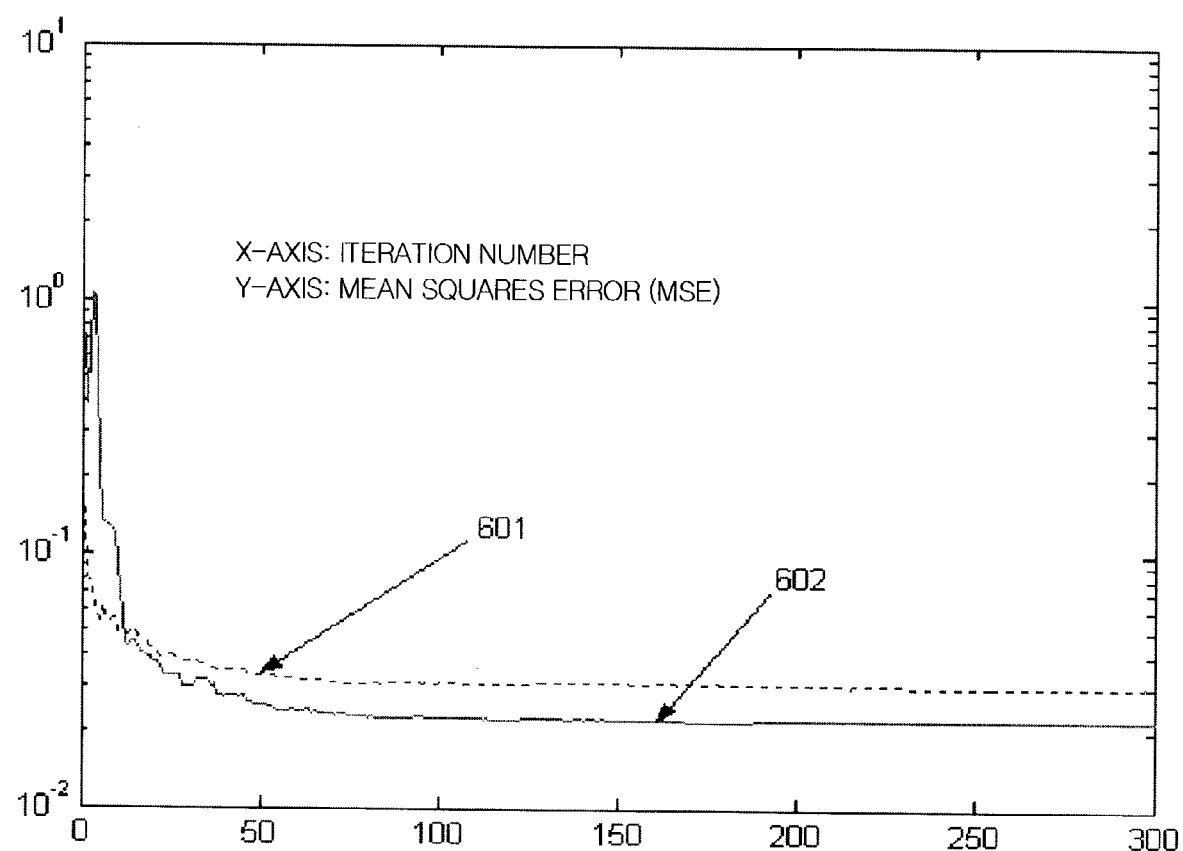
FIG. 6 is a graph depicting Mean Square Errors (MSEs) of 16-Quadrature Amplitude Modulation (QAM) Orthogonal Frequency Division Multiplexing (OFDM) systems, each adopting a conventional recursive least squares (RLS) adaptive filter and the interactive RLS filter of an embodiment of the present invention, respectively.

FIG. 6 is a graph depicting Mean Square Errors (MSEs) of 16-Quadrature Amplitude Modulation (QAM) Orthogonal Frequency Division Multiplexing (OFDM) systems, each adopting a conventional recursive least squares (RLS) adaptive filter and the interactive RLS filter of an embodiment of the present invention, respectively. The graph shows the MSE performances when the interactive adaptive filter of the present invention is applied to digital predistortion, which is disclosed by Mohammad Ghader in an article titled "Adaptive Linearization of Efficient High Power Amplifiers Using Polynomial Predistortion with Global Optimization", thesis of University of Saskatchewan, November 1994 which is incorporated herein by reference In the drawing, the reference numeral 601 indicates a case where the conventional RLS adaptive filter is used, and the reference numeral 602 indicates a case where the interactive adaptive filter of the present invention is used.

While the convention RLS adaptive filter has two filter coefficients, the interactive adaptive filter of the embodiment of the present invention has two sub-filters and each of the sub-filters has two filter coefficients, respectively. In this case, the conventional RLS adaptive filter and the interactive adaptive filter of the present invention have the same computational complexity, but the interactive adaptive filter of the present invention is superior in performance to the conventional one.

Not only the improvement in performance, the interactive adaptive filter of the present invention can reduce the computational load on the adaptation algorithm.

This is because that, in the embodiment of the present invention, a plurality of adaptation algorithms are alternatively executed during a repeated process, and thus they have the least computational complexity of O(1) than the least computational complexity of the conventional fast adaptation algorithm, which is O(N).

While the present invention has been described with respect to certain preferred embodiments, it will be apparent to those skilled in the art that various changes and modifications may be made without departing from the scope of the invention as defined in the following claims.

What is claimed is:

1. An adaptive filter, comprising:
   a segmentation means for segmenting N number of input signals into G number of signal groups wherein N and G are an integer not less than 1;
   sub-filter means having G number of sub-filters, which are corresponding to each of the signal groups, for filtering the corresponding signal group;
   an addition means for summating the output signals of the sub-filter means;

an error computing means for generating an error signal by comparing the output signals of the addition means with a desired signal;

filter coefficient updating means having G number of filter coefficient updating units, each of which is corresponding to each of the sub-filters in the sub-filter means, for updating the filter coefficient of the corresponding sub-filter; and a switching means for inputting the error signal to any one of the filter coefficient updating means optionally with respect to an iteration number k, wherein the iteration number k is an integer number not less than 1 and represents the number of performing entire operations of the adaptive filter.

2. The adaptive filter as recited in claim 1, wherein the switching means inputs the error signal into any one of the sub-filter means optionally at an iteration number k based on a modulo computation with respect to the iteration number k.

3. The adaptive filter as recited in claim 1, wherein each of the filter coefficient updaters in the filter coefficient updating means updates the filter coefficient based on an independent adaptation algorithm.

4. The adaptive filter as recited in claim 3, wherein one of the filter coefficient updaters in the filter coefficient updating means updates the filter coefficient based on a recursive least square (RLS) algorithm.

5. The adaptive filter as recited in claim 3, wherein one of the filter coefficient updaters in the filter coefficient updating means updates the filter coefficient based on a least mean square (LMS) algorithm.

6. The adaptive filter as recited in claim 1, wherein each of the sub-filters in the sub-filter means include:

a multiplication unit corresponding to each signal of the corresponding signal group, for multiplying the signal by the corresponding filter coefficient; and an addition unit for summating the outputs of the multiplication unit.

7. A filtering method of an adaptive filter that includes G number of sub-filters and filter coefficient updaters corresponding to each of sub-filters, comprising the steps of:

a) segmenting N number of input signals into G number of signal groups, wherein N and G are an integer not less than 1;

b) performing sub-filtering with respect to each of the G number of signal groups corresponding to the G number of sub-filters;

c) summating the output signals of the sub-filtering;

d) generating an error signal by comparing the output signals with a desired signal;

e) each of the filter coefficient updaters updating the filter coefficient of the corresponding sub-filters based on the error signal; and f) switching the error signal to any one of the filter coefficient updaters optionally with respect to an iteration number k to update the filter coefficient of the corresponding sub-filters.

8. The filtering method as recited in claim 7, wherein in the step f), the error signal is switched to any one of the filter coefficient updaters optionally with respect to an iteration number k based on a modulo computation with respect to the iteration number k.

9. The filtering method as recited in claim 7, wherein in the step e), one of the filter coefficient updaters adopting an independent adaptation algorithm updates the filter coefficient.

10. The filtering method as recited in claim 9, wherein one of the filter coefficient updaters updates the filter coefficient based on a recursive least square (RLS) algorithm.

11. The filtering method as recited in claim 9, wherein one of the filter coefficient updaters updates the filter coefficient based on a least mean square (LMS) algorithm.

12. The filtering method as recited in claim 7, wherein the step b) includes the steps of:

b1) multiplying the signal by the filter coefficient with respect to each of the G number of signal groups corresponding to the G number of sub-filters; and b2) summating the output signals of the multiplications with respect to each of the G number of signal groups corresponding to the G number of sub-filters.

* * * * *